United States Patent
Aggarwal et al.

(10) Patent No.: US 8,394,229 B2
(45) Date of Patent: Mar. 12, 2013

(54) SUSCEPTOR RING

(75) Inventors: Ravinder Aggarwal, Gilbert, AZ (US); Bob Haro, Gilbert, AZ (US)

(73) Assignee: ASM America, Inc., Phoenix, AZ (US)

( * ) Notice: Subject to any disclaimer, the term of this patent is extended or adjusted under 35 U.S.C. 154(b) by 1220 days.

(21) Appl. No.: 12/187,933

(22) Filed: Aug. 7, 2008

(65) Prior Publication Data

US 2010/0031884 A1   Feb. 11, 2010

(51) Int. Cl.
C23C 16/00 (2006.01)
C23C 16/50 (2006.01)
C23F 1/00 (2006.01)
H01L 21/306 (2006.01)

(52) U.S. Cl. ........... 156/345.27; 118/715; 118/728; 156/345.24; 156/345.28; 156/345.51

(58) Field of Classification Search ........... 118/715, 118/724–732; 156/345.51–345.55
See application file for complete search history.

(56) References Cited

U.S. PATENT DOCUMENTS

| | | | |
|---|---|---|---|
| 5,292,554 A | 3/1994 | Sinha et al. | |
| 5,455,069 A | 10/1995 | Lee | |
| 5,461,214 A * | 10/1995 | Peck et al. | 219/390 |
| D404,370 S | 1/1999 | Kimura | |
| 5,895,530 A | 4/1999 | Shrotriya et al. | |
| 5,960,159 A | 9/1999 | Ikeda et al. | |
| 6,093,252 A * | 7/2000 | Wengert et al. | 118/719 |
| 6,325,858 B1 * | 12/2001 | Wengert et al. | 118/725 |
| 6,343,183 B1 | 1/2002 | Halpin et al. | |
| 6,608,287 B2 | 8/2003 | Halpin et al. | |
| D496,008 S | 9/2004 | Takahashi et al. | |
| D525,127 S | 7/2006 | Cogley et al. | |
| 2002/0011211 A1 | 1/2002 | Halpin | |
| 2003/0000472 A1 | 1/2003 | Lim et al. | |
| 2004/0229002 A1 | 11/2004 | Davis et al. | |
| 2006/0057826 A1 * | 3/2006 | De Boer | 438/482 |

FOREIGN PATENT DOCUMENTS

| | | |
|---|---|---|
| JP | 2003-124167 A | 4/2003 |
| JP | 2006-228802 A | 8/2006 |
| JP | 2007-502022 A | 2/2007 |
| KR | 10-1999-0069084 A | 9/1999 |
| KR | 100460338 B1 | 11/2004 |

OTHER PUBLICATIONS

International Search Report and Written Opinion mailed Mar. 30, 2010, in counterpart International Appl. No. PCT/US2009/044734, 11 pages.
Office Action dated Aug. 3, 2012, received in Chinese Patent Application No. 200980130249.1.

* cited by examiner

*Primary Examiner* — Parviz Hassanzadeh
*Assistant Examiner* — Tiffany Nuckols
(74) *Attorney, Agent, or Firm* — Knobbe, Martens, Olson & Bear LLP

(57) ABSTRACT

A one-piece susceptor ring for housing at least one temperature measuring device is provided. The susceptor ring includes a plate having an aperture formed therethrough and a pair of side ribs integrally connected to a lower surface of the plate. The side ribs are located on opposing sides of the aperture. The susceptor ring further includes a bore formed in each of the pair of side ribs. Each bore is configured to receive a temperature measuring device therein.

19 Claims, 8 Drawing Sheets

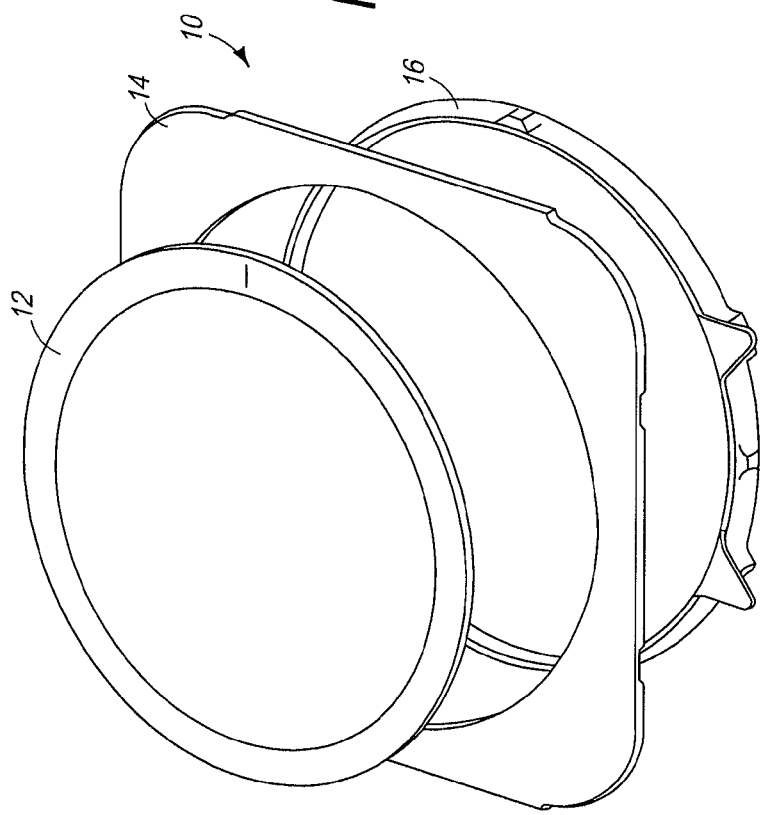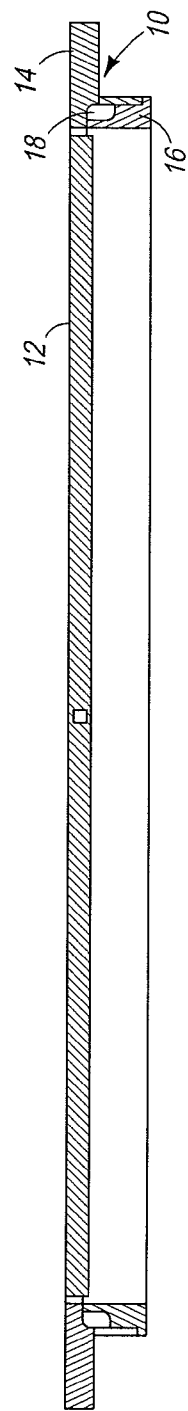

SUSCEPTOR RING

FIELD OF THE INVENTION

This invention is related to semiconductor processing tools, and more particularly, to a ring surrounding a susceptor upon which a substrate is located during a semiconductor manufacturing process.

BACKGROUND OF THE INVENTION

In the processing of semiconductor devices, such as transistors, diodes, and integrated circuits, a plurality of such devices are typically fabricated simultaneously on a thin slice of semiconductor material, termed a substrate, wafer, or workpiece. In one example of a semiconductor processing step during manufacture of such semiconductor devices, the substrate or other workpiece is typically transported into a reaction chamber in which a thin film, or layer, of a material is deposited on an exposed surface of the substrate. Once the desired thickness of the layer of material has been deposited, the substrate may be further processed within the reaction chamber or transported out of the reaction chamber for further processing.

The substrate is typically transferred into the reaction chamber by way of a wafer handling mechanism. The wafer handling mechanism lifts the substrate from a position outside the reaction chamber and inserts the substrate into the reaction chamber through a valve formed in a wall of the reaction chamber. Once the substrate is transferred into the reaction chamber, the substrate is dropped onto a susceptor. After the substrate is received on the susceptor, the wafer handling mechanism is withdrawn from the reaction chamber and the valve is closed such that processing of the substrate can begin. In an embodiment, a susceptor ring is located adjacent to, and surrounds, the susceptor upon which the substrate is disposed during processing.

FIGS. 1-3 illustrates a known susceptor ring assembly 10 typically used in the Epsilon® tools produced by ASM America, Inc. of Phoenix, Ariz. The susceptor ring assembly 10 is a 2-piece structure that is disposed about, and adjacent to, a susceptor 12 that supports a substrate during processing. The susceptor ring assembly 10 is designed to absorb and retain radiant energy from heating source(s) during processing to reduce the amount of energy loss from the edge of the susceptor and substrate. The susceptor ring assembly 10 is also configured to receive and locate thermocouples at different locations about the susceptor 12, wherein the thermocouples are used to measure localized temperatures about the susceptor 12. The susceptor ring assembly 10 includes an upper ring 14 and a lower ring 16, wherein a gap 18 is formed between the upper and lower rings 14, 16. The thermocouples that measure the relative temperature adjacent to the susceptor at the leading edge, trailing edge, and a side edge are at least partially disposed within the gap 18. Each of these thermocouples is comprised of two wires formed of dissimilar metals that are fused at one end to form a thermocouple junction therebetween, an internal ceramic insulator that maintains a separation between the wires, and a sheath made of a non-conductive material able to withstand high temperatures and surround the ceramic insulator and wires.

Due to the fluctuation in temperatures within the reaction chamber as well as the high temperatures to which the two-piece susceptor ring is exposed, there are spaces, or gaps, that may form between the edges of the upper and lower rings 14, 16 of the susceptor ring assembly 10. These spaces often allow process gases to enter the gap 18 in which the thermocouples are located. The process gases can contact the outer surface of the thermocouples and cause deterioration of the thermocouple sheath. The deterioration of the sheath of the thermocouple may lead to a reduction in the accuracy of the temperature measured and the reduction of the lifetime of the thermocouple.

Because of the geometry of some of the thermocouples disposed within the two-piece susceptor ring assembly 10, it is typically necessary that the upper ring 14 is displaced or removed in order to install and remove some of these thermocouples. An access plate located adjacent to a wall of the reaction chamber typically must be removed before the upper ring 14 can be removed. Removing this access plate exposes the reaction chamber to air and moisture in the ambient air that can compromise the ability of the system to run some process applications. The geometry of the thermocouples and the two-piece susceptor ring also makes it difficult to install the thermocouples without scratching and damaging the outer sheath thereof.

A need therefore exists for a susceptor ring that can positively locate thermocouples about a susceptor while minimizing the amount of process gases and air to which the thermocouples are exposed. A need also exists for a susceptor ring that allows an operator to install thermocouples with minimal scratching and damage to the thermocouples.

SUMMARY OF THE INVENTION

In one aspect of the present invention, a one-piece susceptor ring for use in a semiconductor processing tool is provided. The susceptor ring includes a plate having an aperture formed therethrough and at least one rib extending from a lower surface of the plate. The susceptor ring also includes a bore formed in the rib. The bore is configured to receive a temperature measuring device therein.

In another aspect of the present invention, a susceptor ring for use in a semiconductor processing tool is provided. The susceptor ring includes a plate having an aperture formed therethrough and a pair of side ribs integrally connected to a lower surface of the plate. The side ribs are located on opposing sides of the aperture. The susceptor ring further includes a bore formed in each of the pair of side ribs. Each of the bores is configured to receive a temperature measuring device therein.

In a further aspect of the present invention, a one-piece susceptor ring for use in a semiconductor processing tool is provided. The susceptor ring includes a plate having an aperture formed therethrough. The plate has an upper surface and a lower surface. The susceptor ring further includes a first side rib integrally connected to the lower surface of the plate, and a first bore is formed in the first side rib. The susceptor ring also includes a second side rib integrally connected to the lower surface of the plate, and a second bore is formed in the second side rib. A center rib is integrally connected to the lower surface of the plate, and the center rib is located between the first and second side ribs. A third bore is formed in the center rib. A ring rib is integrally connected to the lower surface of the plate, and the ring rib is located about the aperture.

In yet another aspect of the present invention, a reactor for a semiconductor processing tool is provided. The reactor comprises a reaction chamber defining a reaction space therein. A susceptor is disposed within the reaction space. The reactor further includes a one-piece susceptor ring disposed about the susceptor, wherein the susceptor ring is configured to receive at least one temperature measuring device.

In still another aspect of the present invention, a susceptor ring for use in a semiconductor processing tool comprises a plate having a leading edge, a trailing edge, a thickness, and an aperture formed through the thickness. At least one bore is formed into the plate through the trailing edge. The at least one bore is formed as a blind hole in the plate.

Advantages of the present invention will become more apparent to those skilled in the art from the following description of the embodiments of the invention which have been shown and described by way of illustration. As will be realized, the invention is capable of other and different embodiments, and its details are capable of modification in various respects. Accordingly, the drawing(s) and description are to be regarded as illustrative in nature and not as restrictive.

BRIEF DESCRIPTION OF THE DRAWINGS

FIG. 2 is an exploded view of a susceptor ring and susceptor of FIG. 1;

FIG. 3 is a cross-sectional view of the susceptor ring and susceptor of FIG. 2;

DETAILED DESCRIPTION OF THE PREFERRED EMBODIMENT

Figure 1:
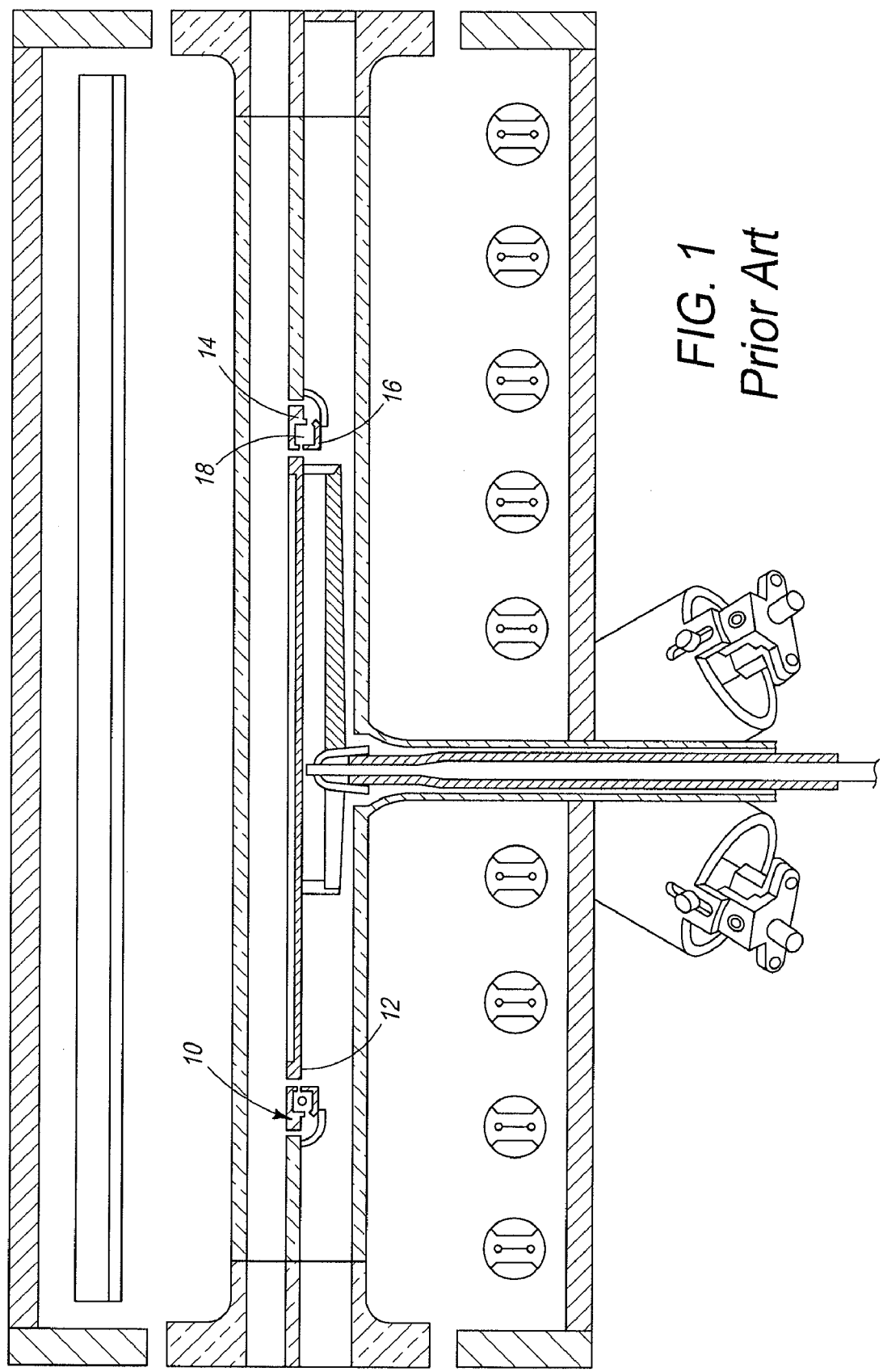
FIG. 1 is a cross-sectional view of a reactor for a semiconductor processing tool commonly known in the prior art.
Figure 4:
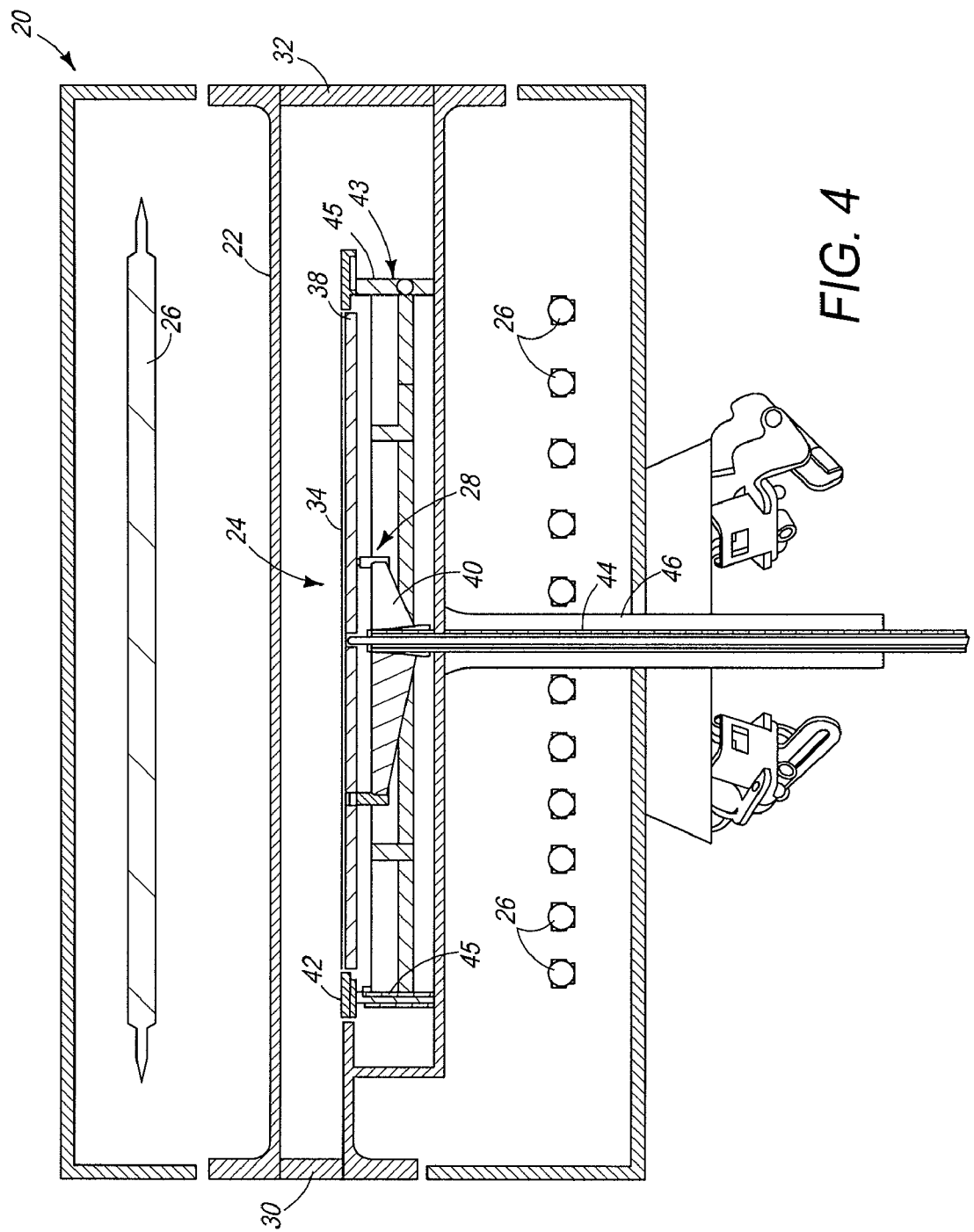
FIG. 4 is a cross-sectional view of a reactor for a semiconductor processing tool having an embodiment of an improved susceptor ring.

Referring to FIG. 4, the cross-section of an exemplary embodiment of a chemical vapor deposition ("CVD") reactor 20 is shown. While the illustrated embodiment is a single substrate, horizontal flow, cold-wall reactor, it should be understood by one skilled in the art that the susceptor ring technology described herein may be used in other types of semiconductor processing reactors. The reactor 20 includes a reaction chamber 22 defining a reaction space 24, radiant heating elements 26 located on opposing sides of the reaction chamber 22, and a susceptor support mechanism 28. The reaction chamber 22 is an elongated member having an inlet 30 for allowing reactant gases to flow into the reaction space 24 and an outlet 32 through which the reactant gases and process by-products exit the reaction space 24. In an embodiment, the reaction chamber 22 is formed of transparent quartz. It should be understood by one skilled in the art that the reaction chamber 22 may be formed of any other material sufficient to be substantially non-reactive with respect to the reactant gases introduced into the reaction chamber 22 and the process by-products resulting from a process reaction.

The heating elements 26 form an upper bank and a lower bank, as shown in FIG. 4. The heating elements 26 are oriented in a spaced-apart manner relative to adjacent heating elements 26 within the same bank. In an embodiment, the heating elements 26 of the upper bank are oriented substantially perpendicular relative to the heating elements 26 of the lower bank. The heating elements 26 provide radiant energy to the reaction chamber 22 without appreciable absorption by the walls of the reaction chamber 22. The heating elements 26 are configured to provide radiant heat of wavelengths absorbed by the substrate 34 being processed.

The susceptor support mechanism 28 includes a susceptor 38, upon which the substrate 34 is disposed during processing, and a susceptor support 40 as shown in FIG. 4. A susceptor ring 42 surrounds at least a portion of the susceptor support mechanism 28. The susceptor support 40 is connected to a shaft 44 that extends downwardly through a tube 46 extending from the lower wall of the reaction chamber 22. A motor (not shown) is configured to rotate the shaft 44, thereby rotating the susceptor support 40 which in turn rotates the susceptor 38 and the substrate 34 disposed thereon. The susceptor ring 42 is maintained at a location spaced above the lower wall of the reaction chamber 22 by a susceptor ring support 43. The susceptor ring support 43 includes a plurality of arms 45 that extend between the upper surface of the lower wall of the reaction chamber 22 and the susceptor ring 42, thereby providing support and positively locating the susceptor ring 42 within the reaction chamber 22.

Referring to FIGS. 5-8, an embodiment of an improved one-piece susceptor ring 42 is shown. In the illustrated embodiment, the susceptor ring 42 is formed as a substantially square member. In an embodiment, the susceptor ring 42 has rounded corners. In another embodiment, the susceptor ring has squared corners (not shown). It should be understood by one skilled in the art that the susceptor ring 42 can be formed as any shape to fit within different shaped and types of reaction chambers 22. The susceptor ring 42 includes a plate 48 having an aperture 50 formed through the thickness of the plate 48. In an embodiment, the aperture 50 is generally formed at the center of the plate 48, but it should be understood by one skilled in the art that the aperture 50 may be offset from the center of the plate 48. The aperture 50 is configured to receive and surround a susceptor 38 (FIG. 4) therein or any other apparatus or mechanism configured to support a substrate 34 during processing. In an embodiment, the aperture 50 is circular, but it should be understood by one skilled in the art that the shape of the aperture 50 should correspond to the shape of the susceptor 38 about which the susceptor ring 42 is disposed.

The plate 48 of the susceptor ring 42 includes a leading edge 51, a trailing edge 53, an upper surface 52, and a lower surface 54, as illustrated in FIGS. 5-8. The plate 48 is aligned within the reaction chamber 22 (FIG. 4) such that the leading edge 51 of the plate 48 is the upstream side and is directed toward the inlet 30 to the reaction space 24 and the trailing edge 53 of the plate 48 is the downstream side and is directed toward the outlet 32 of the reaction space 24. The process gases flow along the flow path A (FIGS. 6 and 8) within the reaction space 24. In the illustrated embodiment, the upper surface 52 is substantially planar. In an embodiment, the upper surface 52 of the susceptor ring 42 is substantially aligned with the upper surface of the susceptor 38. In another embodiment, the upper surface of the susceptor 38 is positioned slightly lower, in an offset, relative to the upper surface 52 of the susceptor ring 42. This offset allows the surface of the substrate 34 being processed to be substantially aligned with the upper surface 52 of the susceptor ring 42 when the substrate 34 is received on the upper surface of the susceptor 38. It should be understood by one skilled in the art that the upper surface 52 of the plate 48 can be positioned in any manner relative to the upper surface of the susceptor 38.

Figure 5:
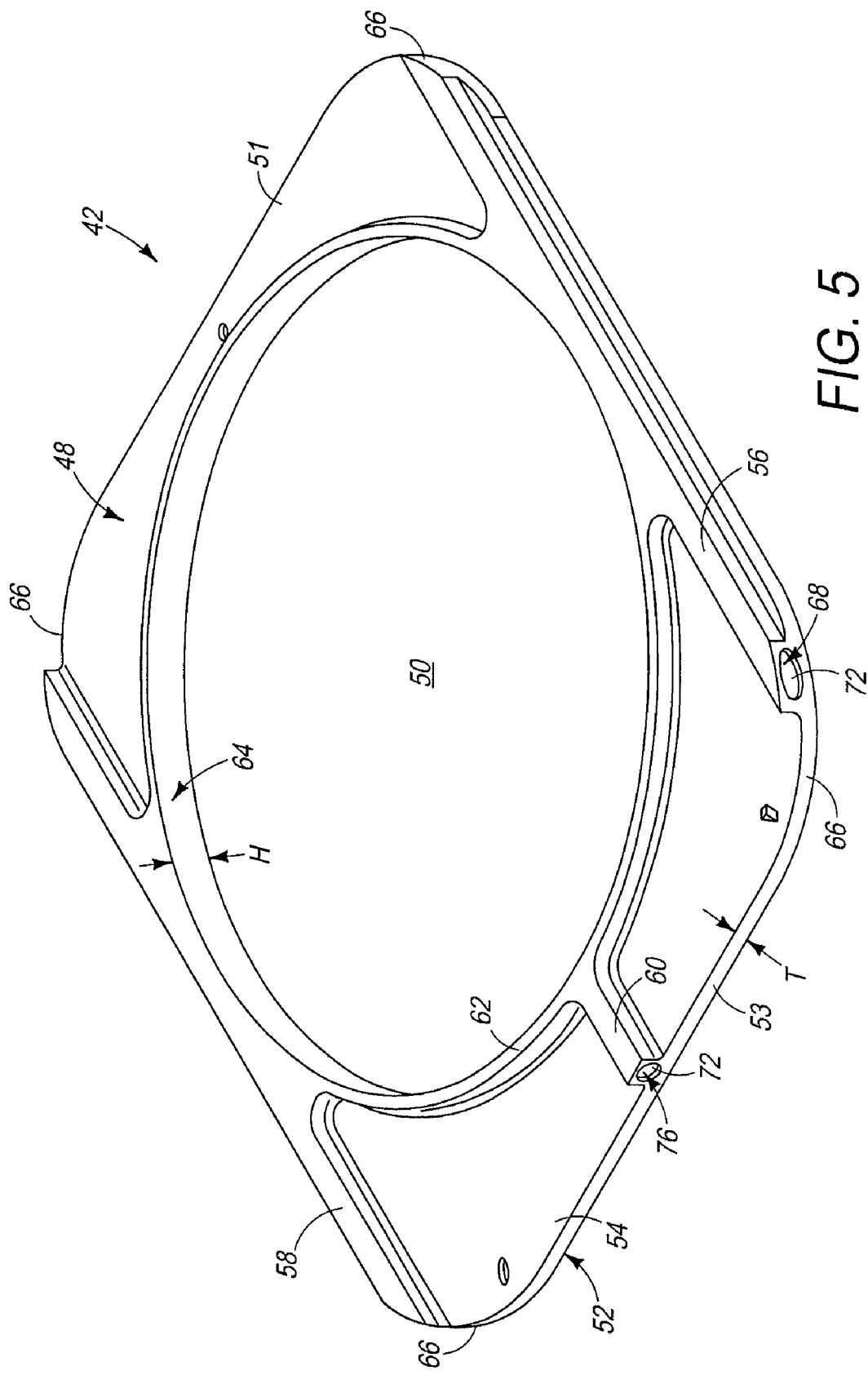
FIG. 5 is a bottom perspective view of the susceptor ring of FIG. 4.
Figure 6:
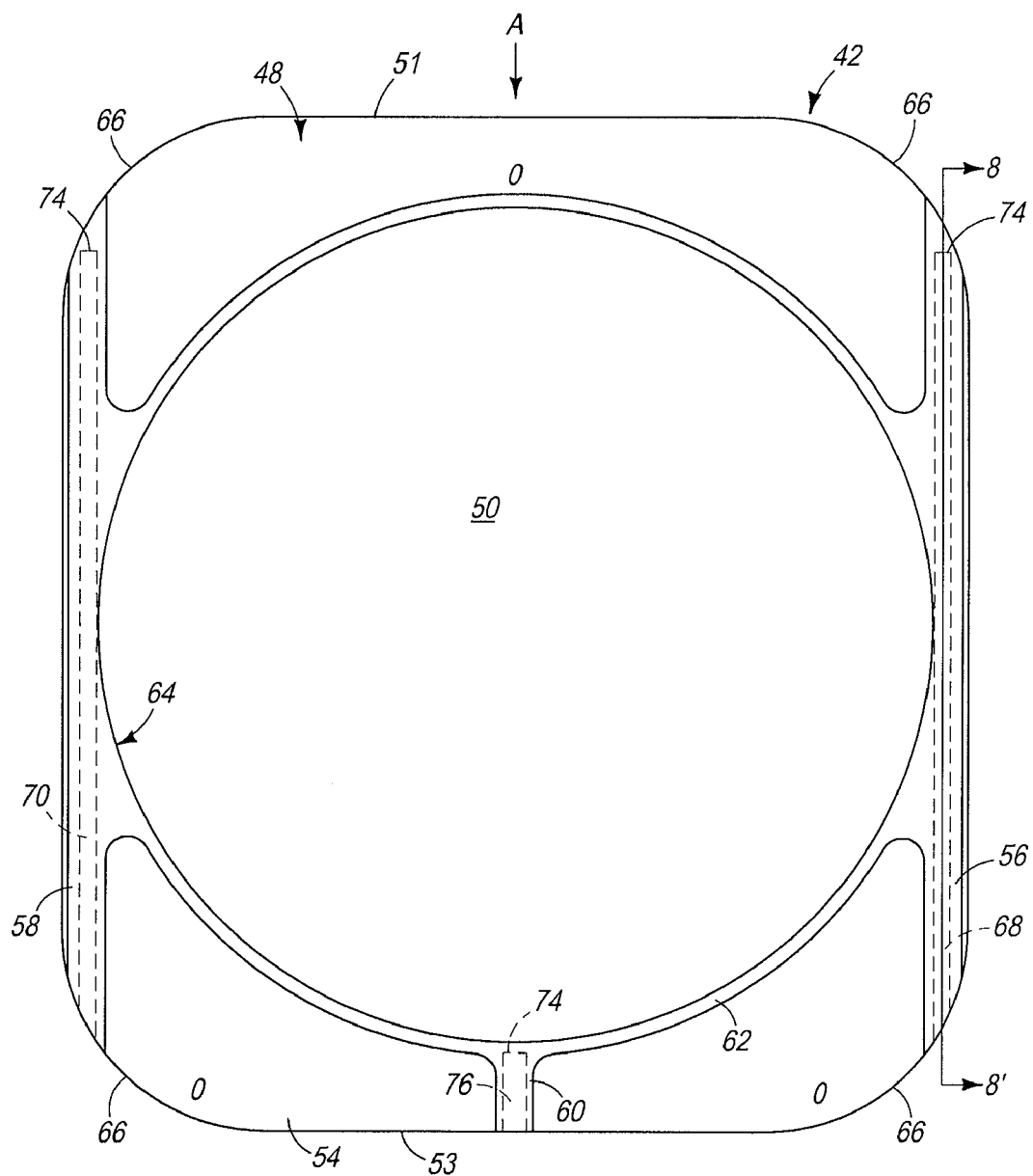
FIG. 6 is a bottom view of the susceptor ring of FIG. 4.
Figure 7:
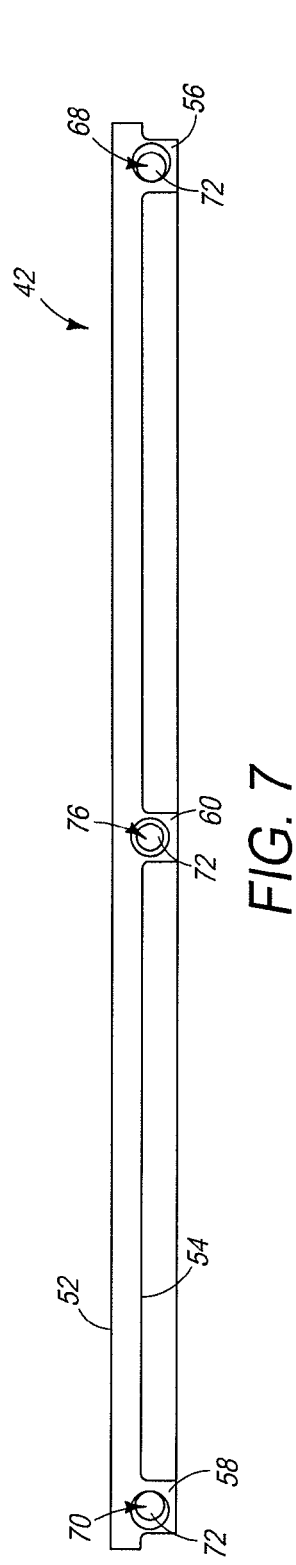
FIG. 7 is a rear view of the susceptor ring of FIG. 4.
Figure 8:
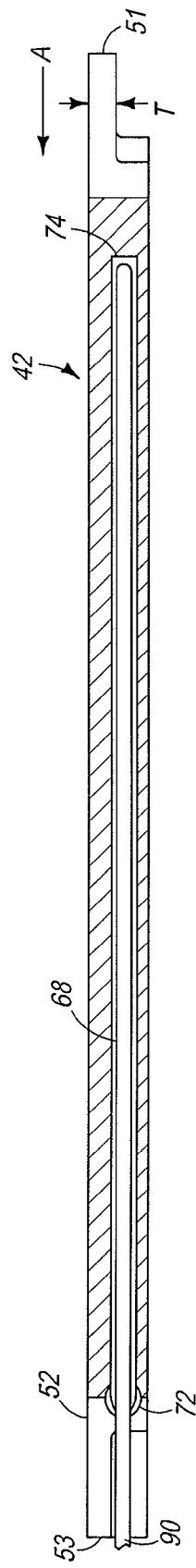
FIG. 8 is a cross-sectional view of the susceptor ring of FIG. 6 taken along the line 8-8'.

The lower surface 54 of the illustrated plate 48 is substantially planar and parallel to the upper surface 52, as shown in FIGS. 5-8. In an embodiment, the thickness T (FIGS. 5 and 8)

of the plate 48 between the upper and lower surfaces 52, 54 is about 0.33 inches (0.84 cm). In another embodiment, the thickness T of the plate 48 is between about 0.1-1 inch (0.25-2.54 cm). It should be understood by one skilled in the art that the thickness T of the plate 48 between the upper and lower surfaces 52, 54 can be sufficient to provide a mass capable of absorbing and retaining radiant energy from the heating elements 26, or other heating elements, to prevent significant heat loss from the outer radial edge of the susceptor 38 and the substrate 34.

In an embodiment, the susceptor ring 42 further includes a first side rib 56, a second side rib 58, a center rib 60, and a ring rib 62 extending from the lower surface 54 of the plate 48, as shown in FIGS. 5-8. The ribs 56, 58, 60 are configured to receive a measuring device 90 (FIG. 8), such as a thermocouple, and the ring rib 62 is configured to provide additional thickness about the aperture 50. The ribs 56, 58, 60, 62 also provide structural support to the susceptor ring 42 as well as additional mass for the absorption and retention of energy. It should be understood by one skilled in the art that the susceptor ring 42 may include additional or fewer ribs, depending upon the number and/or location of measuring devices used as well as the temperature measurement profile desired. In an embodiment, the ribs 56, 58, 60, 62 are integrally connected to form a single raised member extending from the lower surface 54 of the plate 48. In another embodiment, at least two of the ribs are integrally connected together. For example, the center rib 60 can be integrally connected to the ring rib 62 while the first and second side ribs 56, 58 are spaced apart from the center rib 60 and the ring rib 62. In yet another embodiment, each of the ribs 56, 58, 60, 62 is spaced apart, or separated, from each of the other ribs. In an embodiment, the ribs 56, 58, 60, 62 are integrally formed with the plate 48. In another embodiment, at least one of the ribs 56, 58, 60, 62 is formed separately from the plate 48 and attached to the plate 48 during assembly of the susceptor ring 42. In an embodiment, each of the ribs 56, 58, 60, 62 is formed of the same material as the plate 48. In another embodiment, at least one rib 56, 58, 60, 62 is formed of a different material than the plate 48.

In the illustrated embodiment, the ring rib 62 is integrally formed with the plate 48 and extends downwardly from the lower surface 54 of the plate 48 adjacent to the aperture 50, as shown in FIGS. 5-8. The inwardly directed surface 64 of the illustrated ring rib 62 defines the aperture 50. In the illustrated embodiment, the ring rib 62 is substantially circular and extends about the entire circumference of the aperture 50. It should be understood by one skilled in the art that the shape of the ring rib 62 corresponds to the shape of the aperture 50 formed through the susceptor ring 42. In an embodiment, the ring rib 62 extends downwardly from the lower surface 54 of the plate 48 about 0.52 inches (1.32 cm). In another embodiment, the ring rib 62 extends downwardly from the lower surface of the plate 48 between about 0.1-1 inches (0.25-2.54 cm). In an embodiment, the inwardly directed surface 64 defining the aperture 50 has a height H and extends downwardly from the upper surface 52 of the plate 48 about 0.85 inches (2.16 cm). In another embodiment, the inwardly directed surface 64 defining the aperture 50 extends downwardly from the upper surface 52 of the plate 48 between about 0.2-2 inches (0.51-5.08 cm). It should be understood by one skilled in the art that the height H of the inwardly directed surface 64 defining the aperture 50 can be any distance. In an embodiment, the height H of the inwardly directed surface 64 defining the aperture 50 is substantially the same as, or slightly larger than, the thickness of the susceptor 38 about which the susceptor ring 42 is disposable. The height H of the inwardly directed surface 64 defining the aperture 50 is similar to the thickness of the susceptor 38 to reduce or eliminate the heat loss from the outer radial edge of the susceptor 38, particularly during processing a substrate 34.

In an embodiment, the first and second side ribs 56, 58 are elongated, linear members located adjacent to opposing sides of the ring rib 62, as illustrated in FIGS. 5-8. The first and second side ribs 56, 58 can be aligned in a substantially parallel manner relative to each other. In another embodiment, the first and second ribs 56, 58 can also be non-parallel relative to each other. Each of the first and second side ribs 56, 58 extends from the lower surface 54 of the plate 48. In an embodiment, the first and second side ribs 56, 58 extend from the lower surface 54 substantially the same distance that the ring rib 62 extends from the lower surface 54. In another embodiment, the first and second side ribs 56, 58 extend from the lower surface 54 a different distance than the distance the ring rib 62 extends from the lower surface 54. In another embodiment, the first side rib 56 extends a different distance from the lower surface 54 than the second side rib 58. In an embodiment, both the first and second side ribs 56, 58 are integrally connected to the plate 48 as well as the ring rib 62. In another embodiment, the first and second side ribs 56, 58 are spaced apart from the ring rib 62. In an embodiment (not shown), the first and second side ribs 56, 58 form a portion of the opposing lateral edges of the susceptor ring 42. In another embodiment, the first and second side ribs 56, 58 are spaced inwardly from the lateral side edge of the plate 48, as shown in FIG. 5.

In an embodiment, the first and second side ribs 56, 58 extend substantially the entire length of the plate 48 or the entire distance between opposing corners 66 along the same lateral side of the plate 48, as shown in FIGS. 5-6. In another embodiment, the first and second side ribs 56, 58 can extend from the trailing edge 53 of the plate 48 only a portion of the length of the plate 48 between the leading and trailing edges 51, 53. It should be understood by one skilled in the art that the first and second side ribs 56, 58 should have sufficient length to allow the measuring tip, or measuring portion, of a measuring device 90 (FIG. 8) to be disposed at a desired location within the first and second side ribs 56, 58 relative to the susceptor 38 (FIG. 4).

In an embodiment, the first side rib 56 includes a first bore 68 formed therein, and the second side rib 58 includes a second bore 70 formed therein, as illustrated in FIGS. 5-8. In another embodiment, each of the side ribs 56, 58 includes more than one bore formed therein. The illustrated bores 68, 70 are substantially linear, and each bore 68, 70 provides an opening 72 at the end of the side ribs 56, 58 adjacent or near to the trailing edge 53 of the plate 48. In an embodiment, the bores 68, 70 form blind holes into the corresponding rib 56, 58, wherein the end 74 of each bore 68, 70 remains sealed or covered. The bores 68, 70 forming the blind holes are formed into the susceptor ring 42 from or near the trailing edge 53 thereof and directed toward the leading edge 51. The bores 68, 70 being formed as blind holes adjacent to or near the trailing edge 53 reduces or eliminates the amount of process gases that are able to enter into the bores 68, 70 where the process gases can erode or destroy the efficiency of the temperature measuring device 90 (FIG. 8) located within each bore 68, 70. The blind hole can be formed by boring the bores 68, 70 into the ribs 56, 58 without piercing the opposing end of the rib 56, 58 or by boring along the entire length of the ribs 56, 58 and later sealing the end opposite the opening 72 of the bores 68, 70. In another embodiment (not shown), an opening is formed at each end of the side ribs 56, 58 such that the corresponding bore 68, 70 extends the entire length of the side rib 56, 58.

When each side rib 56, 58 includes openings at both ends thereof, the openings can be the same size, or in the alternative, the size of one opening can be a different size than the opposing opening. The shape of the opening at either or both ends may also be different relative to the shape of the cross-section of the bore 68, 70 formed through the side rib 56, 58. In a further embodiment, the opening of the bore 68, 70 adjacent to or near the leading edge 51 of the plate 48 may later be plugged and sealed such that only the opening 72 directed toward the trailing edge 53 of the plate 48 remains open.

Figure 9:
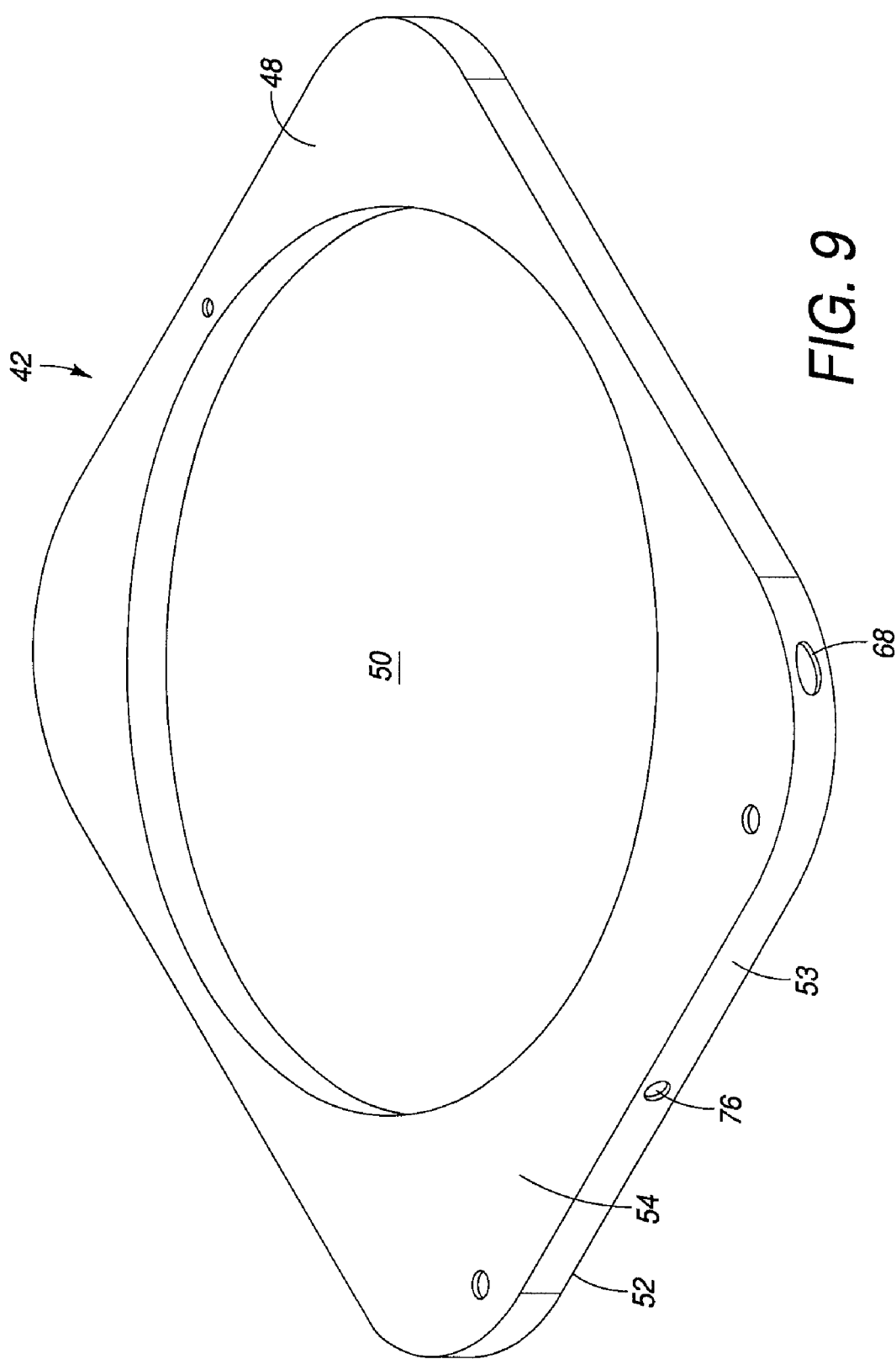
FIG. 9 is a bottom perspective view of another embodiment of a susceptor ring of FIG. 4.

The bores 68, 70 extend at least a portion of the length of the side ribs 56, 58. In an embodiment, the bores 68, 70 extend almost the entire length of the corresponding side rib 56, 58, wherein the ends of the bores 68, 70 terminate less than 1 inch (2.54 cm) from the ends of side ribs 56, 58. In another embodiment, the bores 68, 70 extend more than half the length of the corresponding side rib 56, 58. In yet another embodiment, the bores 68, 70 extend less than half the length of the corresponding side rib 56, 58. In an embodiment, the first bore 68 extends into the first side rib 56 the same distance as the second bore 70 extends into the second side rib 58. In another embodiment, the first bore 68 extends into the first side rib 56 a greater distance than the distance that the second bore 70 extends into the second side rib 58. In a further embodiment, the second bore 70 extends into the second side rib 58 a greater distance than the distance that the first bore 68 extends into the first side rib 56. In a further embodiment, the bores 68, 70 extend the entire length of the corresponding side rib 56, 58. It should be understood by one skilled in the art that the length of the first and second bores 68, 70, or the distance that the bores 68, 70 extend into the corresponding side rib 56, 58, may vary, and the distance may depend upon the desired location at which the measuring tip or junction of the temperature measuring device 90 is to be positioned. The bores 68, 70 can be configured such that the measuring device received therein extends the entire length of the bore 68, 70, nearly the entire length of the bore 68, 70, or any other distance into the bore 68, 70. In yet another embodiment shown in FIG. 9, the susceptor ring 42 does not include ribs extending from the lower surface 42, but instead, the susceptor ring 42 is formed as a solid plate 48 such that the bores 68, 70 are formed into the thickness through the trailing edge 53 between the upper and lower surfaces 52, 54 of the plate 48. Each bore 68, 70 forms a blind hole in the plate 48 adjacent to opposing sides of the aperture 50, and each bore 68, 70 is configured to receive a temperature measuring device 90 (FIG. 8) therein.

Figure 10:
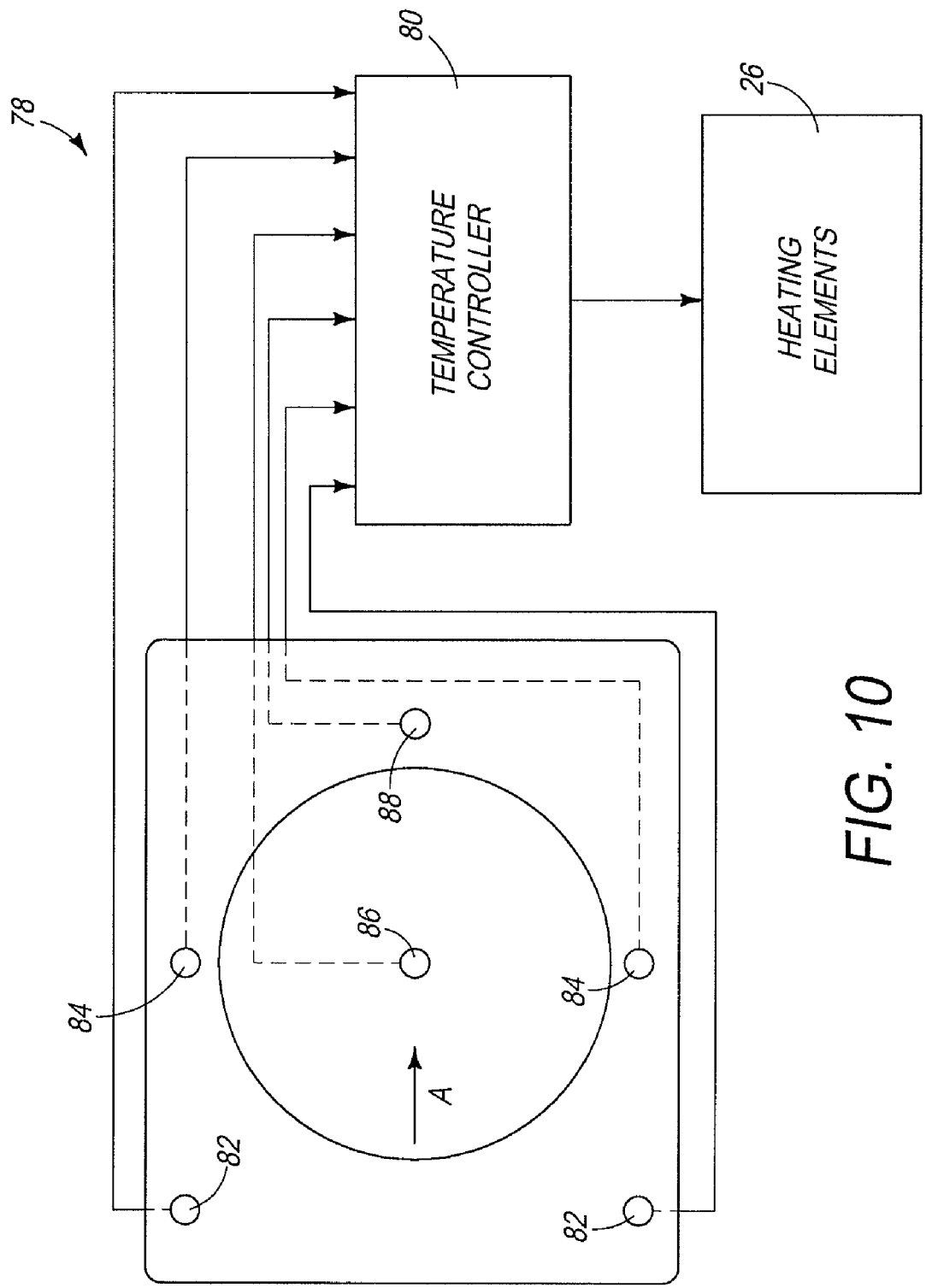
FIG. 10 is a schematic drawing of an embodiment of a temperature control system.

In an embodiment, the first and second bores 68, 70 have a substantially circular cross-section, thereby providing a cylindrical recess into the corresponding side rib 56, 58, as shown in FIGS. 5-8. In another embodiment, the first and second bores 68, 70 have a substantially square cross-section (not shown). It should be understood by one skilled in the art that the first and second bores 68, 70 can have any cross-sectional shape. The first and second bores 68, 70 are configured to receive at least one temperature measuring device 90, such as a thermocouple or the like. It should be understood by one skilled in the art that the cross-sectional shape of the first and second bores 68, 70 can correspond to the shape of the outer surface of the measuring device received therein. In another embodiment, the cross-sectional shape of the first and second bores 68, 70 can be a different shape than the shape of the outer surface of the measuring device received therein. In the embodiment illustrated in FIGS. 5-8, the first and second bores 68, 70 have a substantially circular cross-section and extend nearly the entire length of the corresponding side rib 56, 58 while the end 74 of each bore 68, 70 opposite the openings 72 remains sealed, and the first and second bores 68, 70 are configured to receive a substantially linear temperature measuring device 90, such as a thermocouple as described in U.S. Pat. No. 7,946,762. Such a thermocouple may have a single temperature measuring junction located at a distal end thereof, and the distal end of the thermocouple may be positioned adjacent to, or in contact with, the end 74 of the corresponding bore 68, 70. Such a thermocouple may also have multiple temperature measuring junctions located at different locations along the length thereof, such that when the thermocouple is disposed within one of the bores 68, 70, the junctions are configured to provide localized temperature data at different locations about the susceptor 38, as illustrated in FIG. 10.

In an embodiment, the center rib 60 extends from the lower surface 54 of the plate 48, as illustrated in FIGS. 5-7. In the illustrated embodiment, the center rib 60 is disposed between the first and second side ribs 56, 58, and the center rib 60 is aligned in a substantially parallel manner relative to the first and second side ribs 56, 58. In another embodiment, the center rib 60 is aligned in a non-parallel manner relative to the first and second side ribs 56, 58. In another embodiment (not shown), the susceptor ring 42 includes the first and second side ribs 56, 58, but does not include a center rib 60. In the illustrated embodiment, the center rib 60 extends between the trailing edge 53 and the ring rib 62, and the center rib 60 is integrally connected to the ring rib 62. In another embodiment, the center rib 60 extends from the trailing edge 53 of the plate 48 but is spaced apart from the ring rib 62. The center rib 60 includes a third bore 76 formed therein. The third bore 76 is configured to receive a temperature measuring device 90 therein. In an embodiment, the third bore 76 extends the entire length of the center rib 60 between the trailing edge 53 of the plate 48 to the location at which the center rib 60 is operatively connected to the ring rib 62 such that the end 74 of the third bore 76 remains sealed and located adjacent to the inner surface of the ring rib 62, as shown in FIGS. 5-7. In another embodiment, the length of the third bore 76 is over half the length of the center rib 60. In yet another embodiment, the length of the third bore 76 is less than half the length of the center rib 60. It should be understood by one skilled in the art that the length of the third bore 76 can be any length, wherein the third bore 76 has an opening 72 located adjacent or near to the trailing edge 53 of the plate 48 and the opposing end 74 of the third bore 76 is sealed.

In an embodiment, the third bore 76 has a circular cross-section, as shown in FIGS. 5 and 7. In another embodiment, the third bore 76 has a square cross-section (not shown). It should be understood by one skilled in the art that the cross-sectional shape of the third bore 76 may correspond to the shape of the outer surface of the measuring device received therein. In another embodiment (not shown), an opening is formed at each end of the center rib 60 such that the corresponding bore 76 extends the entire length of the center rib 60. When the center rib 60 includes openings at both ends thereof, the openings can be the same size, or in the alternative, the size of one opening can be a different size than the opposing opening. The shape of the opening at either or both ends may also be different relative to the shape of the cross-section of the third bore 76 formed through the center rib 60. In a further embodiment, the opening of the third bore 76 directed toward the leading edge 51 of the plate 48 may later be plugged and sealed such that only the opening 72 directed toward the trailing edge 53 of the plate 48 remains open. In the illustrated embodiment, the third bore 76 has a substantially circular cross-section and extends nearly the entire length of the center rib 60, and the third bore 76 is configured to receive a linear thermocouple (not shown) such as a thermocouple as described in U.S. Pat. No. 7,946,762.

In the illustrated embodiment, the ends 74 of the first, second, and third bores 68, 70, 76 are sealed, whereby access to the bores 68, 70, 76 is provided through the openings 72 located adjacent or near to the trailing edge 53 of the plate 48, as shown in FIGS. 5-8. The susceptor ring 42 is aligned within the reaction chamber 22 (FIG. 4) such that the opening 72 of each bore 68, 70, 76 is directed downstream toward the outlet 32. Accordingly, the temperature measuring devices 90 (FIG. 8) are inserted through a rear flange adjacent to the outlet 32 and into the bores 68, 70, 76. Because the end 74 of each bore 68, 70, 76 opposite the opening 72 is sealed, the process gases are only able enter the bores 68, 70, 76 through the openings 72, which can be directed in a parallel manner to the flow path A of the process gases. In another embodiment in which the bores 68, 70, 76 have an opening at each end thereof, the opening of the bore directed toward the leading edge 51 of the plate 48 is smaller than the opening of the bore directed toward the trailing edge 53. This alignment reduces the amount of process gases that enter the bores 68, 70, 76, thereby extending the life of the temperature measuring devices disposed within the bores 68, 70, 76. In addition, by reducing the amount of process gases that can enter the bores 68, 70, 76, which extends the lifetime of the temperature measuring devices 90 (FIG. 8) disposed within the bores 68, 70, 76, the lifetime of the susceptor ring 42 is likewise extended. Each time a temperature measuring device fails, the reaction chamber 22 is unsealed to remove the failed temperature measuring device. When the reaction chamber 22 is unsealed, the reaction space 24, and in turn the susceptor ring 42, is exposed to ambient air. This ambient air may degrade the susceptor ring 42 and susceptor 38 after repeated exposures. Thus, by extending the lifetime of the temperature measuring devices located within the bores 68, 70, 76 by reducing the amount of process gases that can contact the temperature measuring devices, the lifetime of the susceptor ring 42 and susceptor 38 is likewise extended by reducing the number of times the susceptor ring 42 and susceptor 38 are exposed to ambient air.

In an embodiment, the susceptor ring 42 is formed of graphite. In another embodiment, the susceptor ring 42 is formed of solid Silicon Carbide (SiC) or Silicon (Si). In yet another embodiment, the susceptor ring 42 is coated with Silicon Carbide (SiC). It should be understood by one skilled in the art that the susceptor ring 42 can be formed of any material with or without a coating, and the material(s) used to form the susceptor ring 42 can be sufficient to absorb and retain heat generated by the heating elements 26, or other heating mechanisms, to prevent or reduce heat loss at the outer radial edge of the susceptor 38 and the substrate 34 while remaining substantially inert relative to the process gases introduced into the reaction space 24.

Referring to FIG. 10, an exemplary temperature control system 78 is shown. The temperature control system 78 includes a temperature controller 80 and multiple temperature measurement devices. In an embodiment, the temperature measurement devices are thermocouples. The thermocouples may be single-junction, bi-junction, or multi-junction thermocouples such that localized temperature measurements can be taken at different locations along the length of the thermocouple. In the illustrated embodiment, separate bi-junction thermocouples are disposed within the first and second bores 68, 70 (FIG. 7) such that a first junction 82 is located adjacent or near to the end 74 of the corresponding bore near the leading edge 51 of the plate 48, and a second junction 84 is located at about half the length of the bore adjacent to the side edge of the substrate 34. The illustrated temperature control system 78 further includes a central thermocouple providing a central junction 86 (FIG. 4) that is located beneath the center of the susceptor 38, and a rear thermocouple disposed within the third bore 76 that provides a rear junction 88 for localized temperature measurement adjacent to the downstream edge of the susceptor 38. The junctions 82, 84, 86, 88 provide localized temperature measurements to the temperature controller 80. The temperature controller 80 receives the temperature data from the thermocouples and determines, based on the temperature data, the amount of power that is to be supplied to the heating elements 26. In another embodiment, the temperature control system 78 includes a pair of first junctions 82 for providing localized temperature measurements upstream of the substrate 34, a pair of second junctions 84 for providing localized temperature measurements adjacent to the side edges of the substrate 34, and a pair of junctions (not shown) that provide localized temperature measurements downstream of the substrate 34, wherein the junctions on opposing sides of the substrate 34 are substantially linearly aligned, and there is no thermocouple or junction for measuring temperature at a location adjacent to the rear edge of the substrate 34. It should be understood by one skilled in the art that the susceptor ring 42 can be configured to receive any number of temperature measuring devices that are capable of providing localized temperature measurements at any number of locations about the substrate 34 being processed.

While preferred embodiments of the present invention have been described, it should be understood that the present invention is not so limited and modifications may be made without departing from the present invention. The scope of the present invention is defined by the appended claims, and all devices, process, and methods that come within the meaning of the claims, either literally or by equivalence, are intended to be embraced therein.

What is claimed is:

1. A one-piece susceptor ring for use in a semiconductor processing tool comprising:
    a plate having an aperture formed therethrough;
    a first side rib, a second side rib, and a center rib extending from a lower surface of said plate, wherein said center rib is located between said first side rib and said second side rib, and wherein said center rib is substantially parallel to each of said first side rib and said second side rib;
    a bore formed in each of said first side rib, said second side rib, and said center rib, wherein the bores of the first side rib and second side rib are substantially linear, wherein each of said bores are configured to receive a temperature measuring device therein, and wherein each of said bores forms a blind hole open to a trailing edge of said plate; and
    a ring rib integrally connected to said lower surface of said plate, said ring rib disposed about said aperature, wherein said center rib extends from the trailing edge to said ring rib.

2. The one-piece susceptor ring of claim 1, wherein said bores have a circular cross-sectional shape.

3. The one-piece susceptor ring of claim 1, further comprising a leading edge opposite the trailing edge, configured such that fluid cannot enter the bore when flowing in a direction from the leading edge toward the trailing edge.

4. A one-piece susceptor ring for use in a semiconductor processing tool, comprising:
    a plate having an aperture formed therethrough;

a ring rib disposed about said aperture and integrally connected to and extending downwardly from a lower surface of said plate;

a pair of separate linear side ribs integrally connected to said lower surface of said plate, said side ribs located on opposing sides of said aperture and aligned substantially parallel to each other;

a center rib located between said side ribs and integrally connected to said lower surface of said plate, wherein said center rib is aligned substantially parallel to each of said side ribs, wherein said center rib extends from a trailing edge of said plate to the ring rib; and a bore formed in each of said pair of side ribs and the center rib, each of said bores configured to receive a temperature measuring device therein.

5. The susceptor ring of claim 4, wherein said ring rib extends from said lower surface of said plate between about 0.1-1 inches.

6. The susceptor ring of claim 4, wherein said pair of side ribs extend from said lower surface of said plate substantially the same distance as said ring rib extends from said lower surface of said plate.

7. The susceptor ring of claim 4, wherein at least one of said pair of side ribs extends a distance from said lower surface of said plate different than a distance from which the other of said pair of side ribs or said ring rib extends from said lower surface of said plate.

8. The susceptor ring of claim 4, wherein said plate and said side ribs include a material selected from the group consisting of graphite, Silicon Carbide (SiC) and Silicon (Si).

9. The susceptor ring of claim 8, wherein said plate and side ribs are coated with Silicon Carbide (SiC).

10. The susceptor ring of claim 4, wherein said plate has a thickness from an upper surface to said lower surface of about 0.1-1 inch.

11. The susceptor ring of claim 4, wherein said pair of side ribs has a length and said bores extend into said side ribs at least half of said length of said side ribs.

12. The susceptor ring of claim 4, wherein said susceptor ring comprises only one piece of material.

13. A one-piece susceptor ring for use in a semiconductor processing tool comprising:

a plate having an aperture formed therethrough, said plate having an upper surface and a lower surface;

a first linear side rib integrally connected to said lower surface of said plate;

a first bore formed in said first side rib;

a second linear side rib integrally connected to said lower surface of said plate;

a second bore formed in said second side rib;

a linear center rib integrally connected to said lower surface of said plate, said center rib being located between said first and second side ribs;

a third bore formed in said center rib; and a ring rib integrally connected to said lower surface of said plate, said ring rib located about said aperture, wherein said first side rib, said second side rib, and said center rib are aligned substantially parallel to each other, and wherein said center rib extends from a trailing edge of said plate to said ring rib.

14. The one-piece susceptor ring of claim 13, wherein said first side rib, and said second side rib, and said center rib are integrally connected to said ring rib.

15. The one-piece susceptor ring of claim 13, wherein each of said first bore, second bore and third bore includes an opening, said openings being located adjacent to a trailing edge of said plate.

16. The one-piece susceptor ring of claim 15, wherein an end opposite said opening of each of said first bore, second bore, and third bore is sealed.

17. A reactor for a semiconductor processing tool comprising:

a reaction chamber defining a reaction space therein, the reaction chamber including a gas inlet and a gas outlet;

a susceptor disposed within said reaction space; and a one-piece susceptor ring disposed about said susceptor, said susceptor ring having a leading edge directed toward the inlet, a trailing edge directed toward the outlet, a pair of opposing lateral edges, said susceptor ring including first, second, and third bores extending from the trailing edge toward the leading edge, the first bore positioned adjacent one of the lateral edges, the second bore positioned adjacent the other of the lateral edges, the third bore having an end adjacent a downstream edge of the susceptor, each of the bores being configured to receive at least one temperature measuring device, wherein each of said first bore and said second bore are substantially linear, wherein said first bore, said second bore, and said third bore are substantially parallel to each other, and wherein each of the at least one temperature measuring devices afeis wholly positioned downstream of the leading edge.

18. The reactor of claim 17, wherein said susceptor ring is formed of graphite.

19. The reactor of claim 17, wherein each of said bores comprises a blind hole.

* * * * *

UNITED STATES PATENT AND TRADEMARK OFFICE
CERTIFICATE OF CORRECTION

PATENT NO. : 8,394,229 B2
APPLICATION NO. : 12/187933
DATED : March 12, 2013
INVENTOR(S) : Aggarwal et al.

It is certified that error appears in the above-identified patent and that said Letters Patent is hereby corrected as shown below:

In the Claims

In Claim 17, column 12, line 43, please change "afeis" to -- is --.

Signed and Sealed this
Tenth Day of December, 2013

Margaret A. Focarino
*Commissioner for Patents of the United States Patent and Trademark Office*